(12) United States Patent
Markert et al.

(10) Patent No.: US 10,536,307 B2
(45) Date of Patent: Jan. 14, 2020

(54) METHOD AND APPARATUS FOR GENERATING AT LEAST ONE RF SIGNAL

(71) Applicant: Alcatel Lucent, Nozay (FR)

(72) Inventors: Daniel Markert, Stuttgart (DE); Yu Xin, Stuttgart (DE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 16/307,258

(22) PCT Filed: May 30, 2017

(86) PCT No.: PCT/EP2017/062985
§ 371 (c)(1),
(2) Date: Dec. 5, 2018

(87) PCT Pub. No.: WO2017/211615
PCT Pub. Date: Dec. 14, 2017

(65) Prior Publication Data
US 2019/0305994 A1  Oct. 3, 2019

(30) Foreign Application Priority Data
Jun. 9, 2016 (EP) .................................. 16305675

(51) Int. Cl.
*H03K 7/08* (2006.01)
*H04L 25/49* (2006.01)
(Continued)

(52) U.S. Cl.
CPC ........... *H04L 25/4902* (2013.01); *H01Q 5/30* (2015.01); *H03K 5/135* (2013.01); *H03M 3/506* (2013.01)

(58) Field of Classification Search
CPC ...... H04L 25/4902; H01Q 5/30; H03K 5/135; H03M 3/506
(Continued)

(56) References Cited

U.S. PATENT DOCUMENTS

2005/0083085 A1 * 4/2005 Harron .................. H03B 21/02
327/105
2015/0146773 A1 5/2015 Ma et al.

FOREIGN PATENT DOCUMENTS

EP  2728746 A1  5/2014
EP  2985910 A1  2/2016

OTHER PUBLICATIONS

Thomas Johnson et. al 'Noise Shaped Pulse Position Modulation for RF Switch-mode Power Amplifiers' Proceedings of the 6th European Microwave Integrated Circuits Conference, Manchester, UK Oct. 10-11, 2011 . . pp. 320-323.
(Continued)

*Primary Examiner* — Zewdu A Kassa
(74) *Attorney, Agent, or Firm* — Harness, Dickey & Pierce, P.L.C.

(57) ABSTRACT

At least one embodiment relates to generating at least one RF signal based on at least one digital baseband signal at a first clock rate. At least one digital pulse sequence at a second clock rate corresponding to a center frequency of the RF signal is modulated based on the digital baseband signal. Pulses of the pulse sequence are quantized based on a time grid of a third clock rate. A ratio between a number of second clock cycles corresponding to one first clock cycle and a number of third clock cycles corresponding to one first clock cycle is non-integer.

15 Claims, 12 Drawing Sheets

(51) Int. Cl.
*H03K 5/135* (2006.01)
*H01Q 5/30* (2015.01)
*H03M 3/00* (2006.01)

(58) Field of Classification Search
USPC ........ 375/238, 232, 230, 224, 316, 219, 295
See application file for complete search history.

(56) References Cited

OTHER PUBLICATIONS

International Search Report PCT/ISA/210 for International Application No. PCT/EP2017/062985 dated Jul. 7, 2017.
Extended European Search Report for European Application No. EP16305675 dated Oct. 31, 2016.
Written Opinion of the International Searching Authority for International Application No. PCT/EP2017/062985 dated Jul. 7, 2017.

* cited by examiner

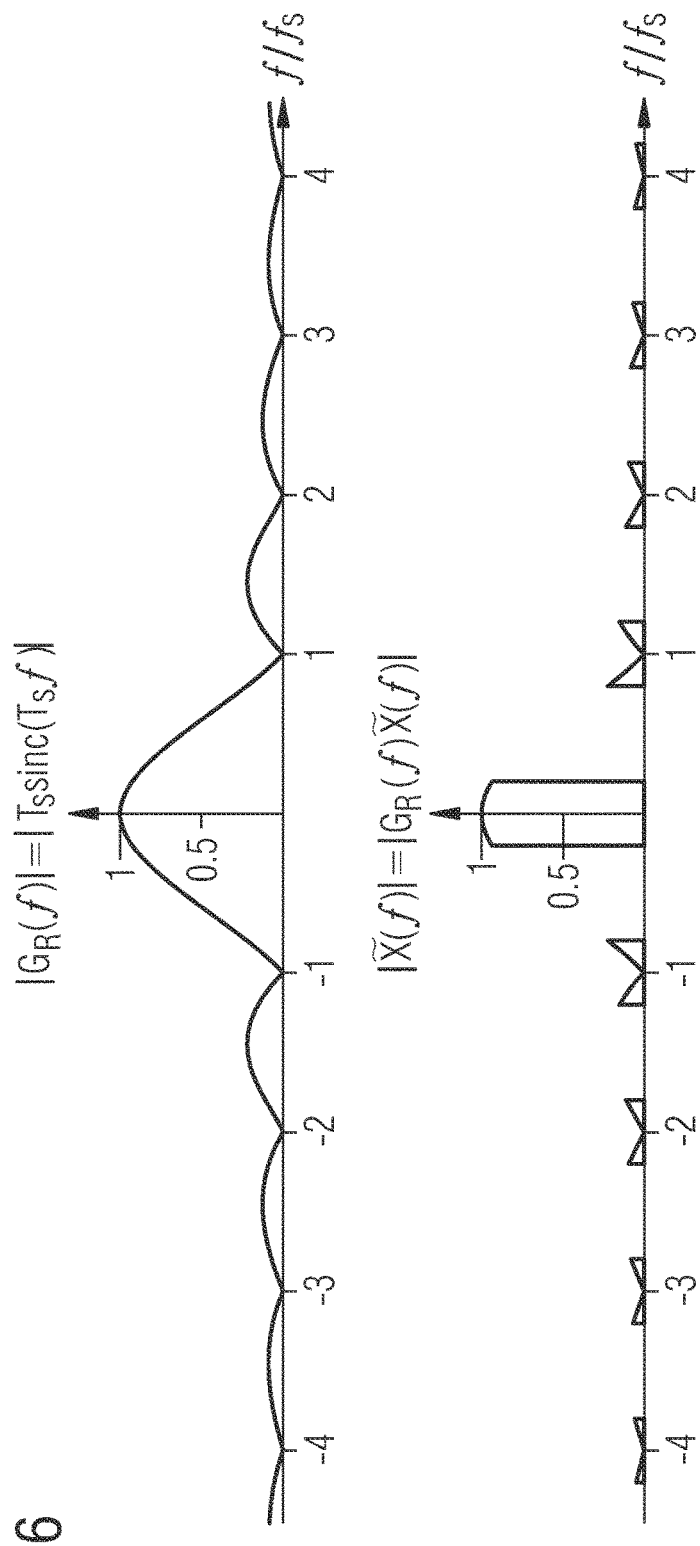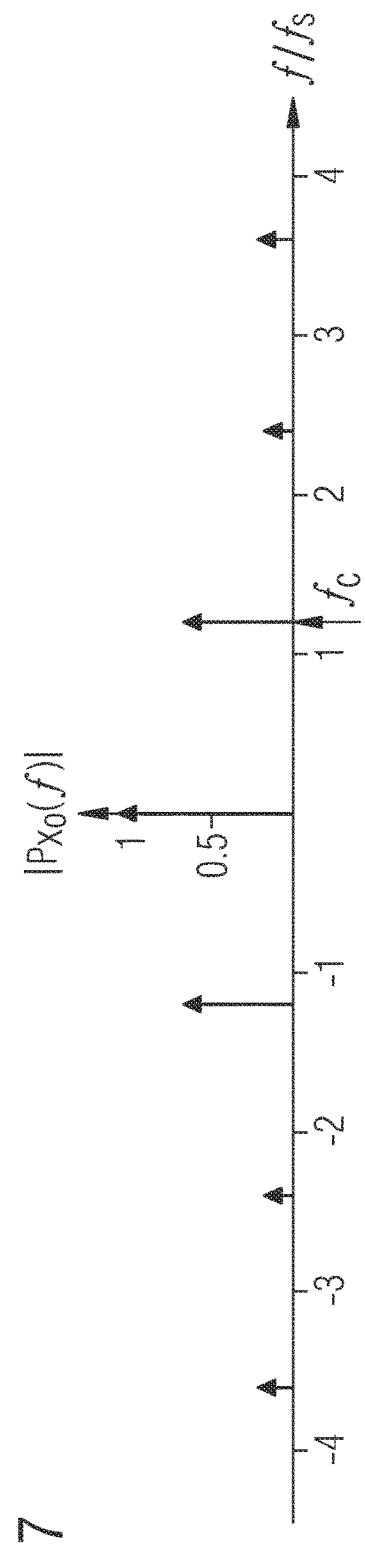

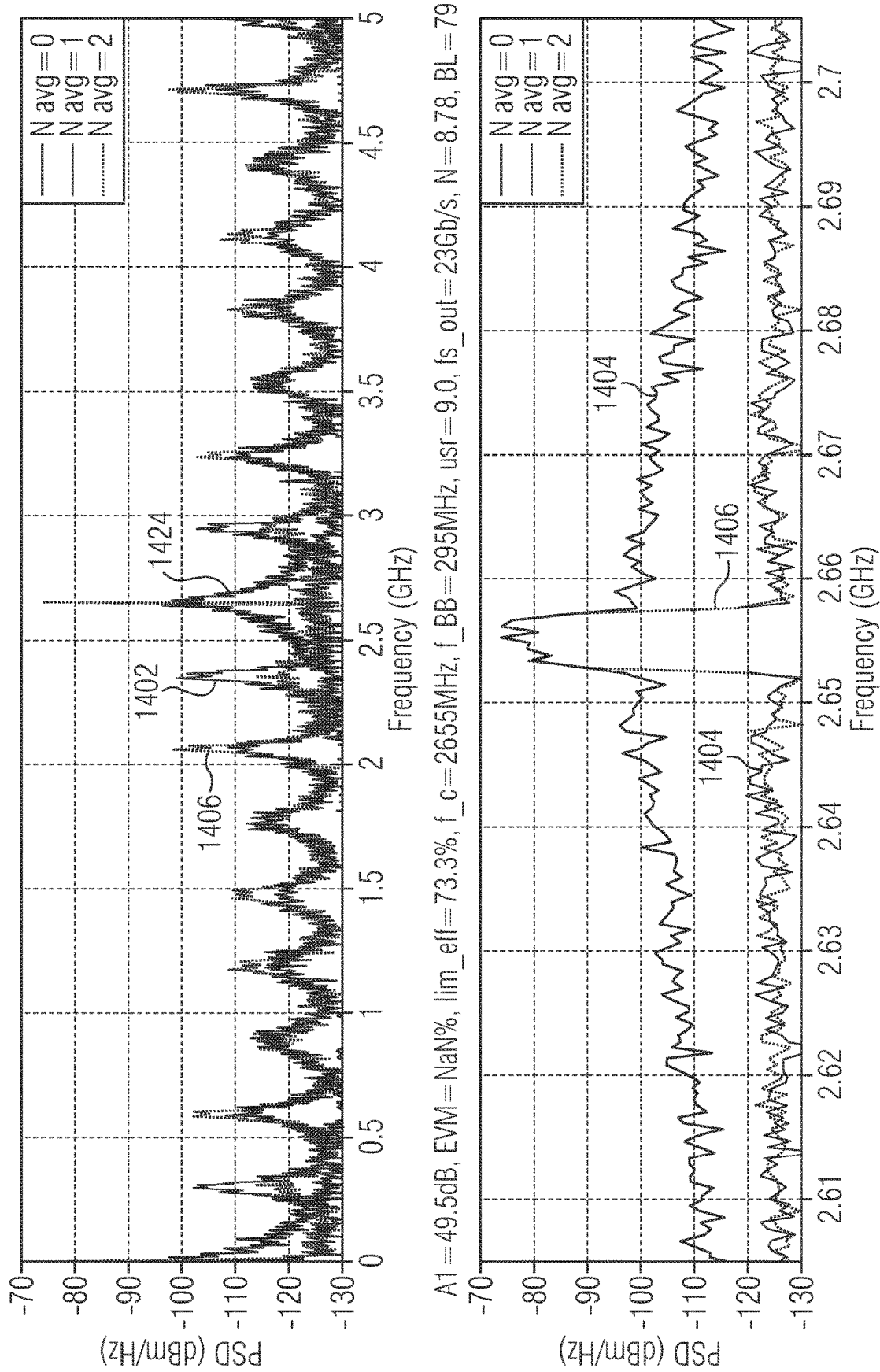

METHOD AND APPARATUS FOR GENERATING AT LEAST ONE RF SIGNAL

CROSS-REFERENCE TO RELATED APPLICATIONS

This application is a national phase under 35 U.S.C. § 371 of PCT International Application No. PCT/EP/0062985 which has an International filing date of May 30, 2017, which claims priority to European Application No. EP 16305675.7 filed Jun. 9, 2016, the entire contents of each of which are hereby incorporated by reference.

The present disclosure generally relates to communication systems and, more particularly, to a digital generation of Radio Frequency (RF) signals.

BACKGROUND

Massive Multiple-Input and Multiple-Output (MIMO) is a key candidate for addressing the rising demand of mobile data volume for 5G and beyond. Massive MIMO especially shines in rich scattering environments with a high number of users per area, where classical macro- and small-cell deployment are limited by interference. However, the Massive MIMO concept relies on massive/large numbers of active transceivers to exploit the diver-sity of the channel.

Obviously, one can simply implement as many conventional RF transmitter chains as in-dependently controlled RF outputs are required. However, size and cost therefore increase linearly with the number of outputs. RF transceiver chip manufacturers already address this issue by integrating multiple transceiver chains in a single chip Integrated Circuit (IC). Nevertheless, an economic single chip solution for massive numbers of transceivers using conventional RF circuitry is unlikely in the frequency range below 6 GHz.

Compared to analog circuit concepts, duplication and parallelization is not a problem in the digital domain. Once implemented in a digital circuit, a transmit chain can be duplicated with low effort utilizing high-speed interfaces as RF outputs. Even though several digital transmitter concepts are already published, they lack the required performance and/or are too complex to be implemented effectively. The key performance indicators are signal quality (e.g., Adjacent Channel Power Ratio, ACPR, and Error-Vector-Magnitude, EVM), coding efficiency (ratio of wanted to unwanted output power), spurious-free bandwidth (BW) and the implementation effort.

Thus, there is a desire for improved RF transmitter concepts.

SUMMARY

According to a first aspect of the present disclosure, it is provided a method for generating at least one RF signal. The method includes receiving at least one digital baseband signal at a first clock rate. At least one digital pulse sequence at a second clock rate substantially corresponding to a center or carrier frequency of the RF signal is modulated based on the digital baseband signal. Positions and/or widths of pulses of the pulse sequence are quantized based on a time grid of a third clock rate. A ratio between a number of second clock cycles (corresponding to the second clock rate) within one first clock cycle (corresponding to the first clock rate) and a number of third clock cycles (corresponding to the third clock rate) within one first clock cycle is non-integer. In other words, a ratio between the third and the second clock rate is non-integer, while a ratio between the third and the first clock rate is integer and a ratio between the second and the first clock rate is also integer. After modulation, the at least one modulated digital pulse sequence is outputted for further digital or analog signal processing.

In some embodiments, the second clock rate is a first integer multiple of the first clock rate and wherein the third clock rate is a second integer multiple of the first clock rate higher than the first multiple.

In some embodiments, the first clock rate can be below 500 MHz, the second clock rate can be between twice and 50 times the first clock rate, and the third clock rate can be higher than 50 times the first clock rate.

In some embodiments, modulating the digital pulse sequence further includes mapping a phase of the baseband signal to one or more pulse positions in the time grid of the third clock rate, and/or mapping an amplitude of the baseband signal to one or more pulse widths and/or densities in the time grid of the third clock rate.

Mathematically, the non-integer ratio between the third and the second clock rate can also be expressed as $f_3 \neq a^* f_2$, wherein $f_2$ denotes the second clock rate, $f_3$ denotes the third clock rate, and $a \in \mathbb{N}^+$. In some embodiments, the first, second, and third clock rates can be set according to $f_3 = a^* f_2 - b^* f_1$, wherein $f_1$ denotes the first clock rate, $f_2$ denotes the second clock rate, $f_3$ denotes the third clock rate, $a \in \mathbb{N}^+$, and $b \in \mathbb{Z} \setminus \{0\}$.

In some embodiments, the method can further optionally include amplifying the modulated digital pulse sequence using an analog power amplifier.

In some embodiments, the method can further optionally include filtering the amplified pulse sequence using an analog filter to generate an analog RF signal.

In some embodiments, the method can further optionally include transmitting the analog RF signal via one or more antennas.

In some embodiments, the method can optionally include receiving a first digital baseband signal at a first baseband clock rate, receiving at least a second digital baseband signal at a second baseband clock rate, modulating pulses of a first digital pulse sequence at a first carrier clock rate based on the first digital baseband signal, wherein the pulses are quantized based on a time grid of an output clock rate, modulating pulses of a second digital pulse sequence at a second carrier clock rate based on the second digital baseband signal, wherein the pulses are quantized based on the time grid of the output clock rate. A ratio between a number of carrier clock cycles corresponding to one respective baseband clock cycle and a number of output clock cycles corresponding to one respective baseband clock cycle is non-integer.

In some embodiments, the method can further optionally include transmitting the first modulated pulse sequence via a first antenna and transmitting the second modulated pulse sequence via a second antenna.

According to a further aspect of the present disclosure, it is provided a computer program having a program code for performing embodiments of the method, when the computer program is executed on a programmable hardware device.

According to yet a further aspect of the present disclosure, it is provided an apparatus for generating at least one RF signal. The apparatus comprises an input configured to receive at least one digital baseband signal at a first clock rate. The apparatus further comprises a processor (and possibly associated memory) configured to modulate at least one digital pulse sequence at a second clock rate corresponding to a center frequency of the RF signal based on the digital baseband signal. The processor is configured to quantize pulses of the pulse sequence based on a time grid of a third clock rate. A ratio between a number of second clock cycles (corresponding to the second clock rate) corresponding to one first clock cycle (corresponding to the first clock rate) and a number of third clock cycles (corresponding to the third clock rate) corresponding to one first clock cycle is non-integer. The apparatus further comprises an output configured to output or forward the at least one modulated digital pulse sequence.

In some embodiments, the apparatus is configured to set the second clock rate as a first multiple of the first clock rate and to set the third clock rate as a second multiple of the first clock rate higher than the first multiple.

In some embodiments, the processor is configured to map a phase of the baseband signal to one or more pulse positions in the time grid of the third clock rate, and/or to map an amplitude of the baseband signal to one or more pulse widths and/or densities in the time grid of the third clock rate.

In some embodiments, the apparatus is configured to set the first, second, and third clock rates according to $f_3=a*f_2-b*f_1$, wherein $f_1$ denotes the first clock rate, $f_2$ denotes the second clock rate, $f_3$ denotes the third clock rate, $a \in \mathbb{N}^+$, and $b \in \mathbb{Z} \setminus \{0\}$.

In some embodiments, the apparatus can further comprise an analog power amplifier configured to amplify the modulated digital pulse sequence, an analog filter configured to filter the amplified pulse sequence to generate an analog RF signal, and one or more antennas configured to transmit the analog RF signal.

In some embodiments, the input can be configured to receive a first digital baseband signal at a first baseband clock rate and to receive at least a second digital baseband signal at a second baseband clock rate. The processor is configured to modulate pulses of a first digital pulse sequence at a first carrier clock rate based on the first digital baseband signal, wherein the pulses are quantized based on a time grid of an output clock rate, and configured to modulate pulses of a second digital pulse sequence at a second carrier clock rate based on the second digital baseband signal, wherein the pulses are quantized based on the time grid of the output clock rate. A ratio between a number of carrier clock cycles corresponding to one respective baseband clock cycle and a number of output clock cycles corresponding to one respective baseband clock cycle is non-integer.

In some embodiments, the apparatus is configured to set the first clock rate below 500 MHz, to set the second clock rate between twice and 50 times the first clock rate, and to set the third clock rate higher than 50 times the first clock rate.

In some embodiments, the apparatus can further comprise a memory accessible by the processor and having prestored thereon at least one of the following parameters: $N_1$, $N_2$, a, b, or the center frequency, wherein $N_1$ represents a ratio between the second and first clock rate, $N_2$ represents a ratio between the third and the first clock rate, $a \in \mathbb{N}^+$, $b \in \mathbb{Z} \setminus \{0\}$, with $f_3=a*f_2-b*f_1$, wherein $f_1$ denotes the first clock rate, $f_2$ denotes the second clock rate, $f_3$ denotes the third clock rate.

In some embodiments, the apparatus can form the basis of a transmitter to generate and transmit at least one RF signal. The transmitter comprises the apparatus, an analog power amplifier configured to amplify the modulated digital pulse sequence, an analog filter configured to filter the amplified pulse sequence to generate an analog RF signal, and one or more antennas configured to transmit the analog RF signal.

In some embodiments, the transmitter or the apparatus can further comprise a first antenna configured to transmit the first modulated pulse sequence, and a second antenna configured to transmit the second modulated pulse sequence.

In some embodiments, the apparatus comprises a field-programmable gate array.

Embodiments can enable significant improvements of SNR close to a wanted RF signal without additional complexity. Furthermore, embodiments are feasible for implementation in FPGAs. This can open up a new way for realization of a transmitter. One can save the entire low power analogue part in a transmitter including DAC, mixer, as well as their circuitries. This can result not only in low product costs but also space saving.

BRIEF DESCRIPTION OF THE FIGURES

Some embodiments of apparatuses and/or methods will be described in the following by way of example only, and with reference to the accompanying figures, in which FIG. 1 schematically illustrates a concept of digital pulse width modulation;

FIG. 6 illustrates the zero-order-hold effect for the signal of FIG. 5;

FIG. 7 shows a further aliasing effect due to PWM operation;

FIG. 14 shows output spectra of digitally generated RF signals.

DESCRIPTION OF EXAMPLES

Figure 1:
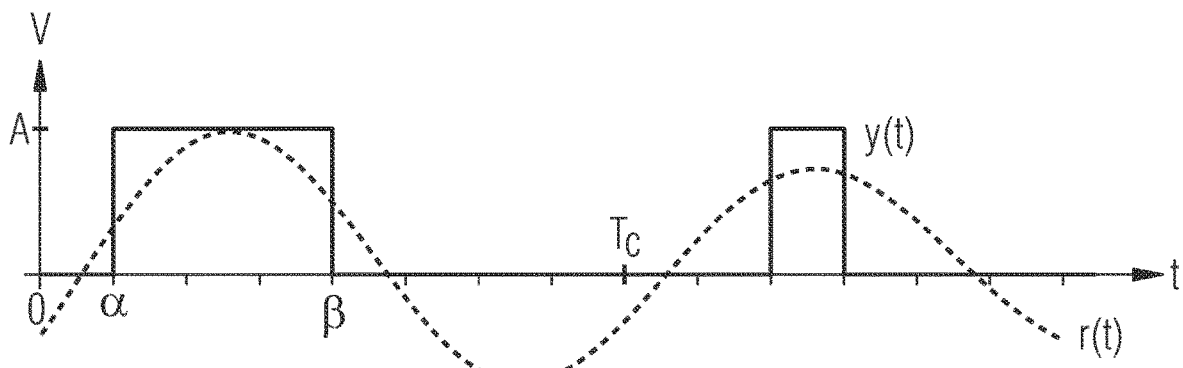

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

The present disclosure presents example implementations of all-digital transmitter solutions particularly but not exclusively suited for Massive MIMO systems for mobile communications. Massive MIMO can make use of a very large number of service antennas (e.g., hundreds or thousands) that can be operated fully coherently and adaptively and is a key candidate to address the challenges of present and future mobile communication standards, especially to provide higher capacity in dense urban scenarios. The present disclosure demonstrates that all-digital transmitters can be employed to reduce size, cost and engi-neering effort of heavily parallelized transmit architectures.

Examples of present mobile communication standards to which examples of the present disclosure may be applied to are the Third Generation Partnership Project (3GPP)-standardized mobile communication networks, where the term mobile communication system is used synonymously to mobile communication network. The mobile or wireless communication system may correspond to, for example, a Long-Term Evolution (LTE), an LTE-Advanced (LTE-A), High Speed Packet Access (HSPA), a Universal Mobile Telecommu-nication System (UMTS) or a UMTS Terrestrial Radio Access Network (UTRAN), an evolved-UTRAN (e-UTRAN), a Global System for Mobile communication (GSM) or En-hanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Examples of the present disclosure can be applied to base stations as well as mobile user devices. A base station can be operable to communicate with one or more active mobile devices and a base station can be located in or adjacent to a coverage area of another base station, e.g. a macro cell base station or small cell base station. A base station can be located in the fixed or stationary part of the network or system. A base station may correspond to a remote radio head, a transmission point, an access point, radio equipment, a macro cell, a small cell, a micro cell, a femto cell, a metro cell etc. A base station transceiver may correspond to a base station understood as a logical concept of a node/entity terminating a radio bearer or connectivity over the air interface between a terminal/mobile transceiver and a radio access network. A base station can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a transmission point, a relay transceiver etc., which may be further subdivided in a remote unit and a central unit.

Hence, embodiments may provide a mobile communication system comprising one or more mobile user devices and one or more base station, wherein the base stations may establish macro cells or small cells, as e.g. pico-, metro-, or femto cells. A mobile user device may correspond to a smartphone, a cell phone, user equipment, radio equipment, a mobile, a mobile station, a laptop, a notebook, a personal computer, a Personal Digital Assistant (PDA), a Universal Serial Bus (USB)-stick, a car, a mobile relay transceiver for D2D communication, etc. A mobile transceiver may also be referred to as User Equipment (UE) or mobile in line with the 3GPP terminology.

A mobile user devices can be associated, camped on, or registered with a base station or cell. The term cell refers to a coverage area of radio services provided by a base station, e.g. a NodeB (NB), an eNodeB (eNB), a remote radio head, a transmission point, etc. A base station may operate one or more cells on one or more frequency layers, in some embodiments a cell may correspond to a sector. For example, sectors can be achieved using sector antennas, which provide a characteristic for covering an angular section around a remote unit or base station transceiver. In some embodiments, a base station may, for example, operate three or six cells covering sectors of 120° (in case of three cells), 60° (in case of six cells) respectively. A base station may operate multiple sectorized antennas. In the following a cell may represent a corresponding base station generating the cell or, like-wise, a base station may represent a cell the base station generates.

Base stations and mobile user devices commonly make use of modulated RF signals for communicating with each other. For certain applications it is advantageous to represent amplitude and phase modulated signals by only few, mostly binary, amplitude levels. There are various known encoder concepts that map band-limited amplitude and phase modulated signals, also referred to as baseband signals, to binary bit sequences that represent this baseband signal at a carrier frequency. There are two complementary fundamental concepts: PWM (Pulse-Width-Modulation) and DSM (Delta-Sigma-Modulation).

Figure 2A:
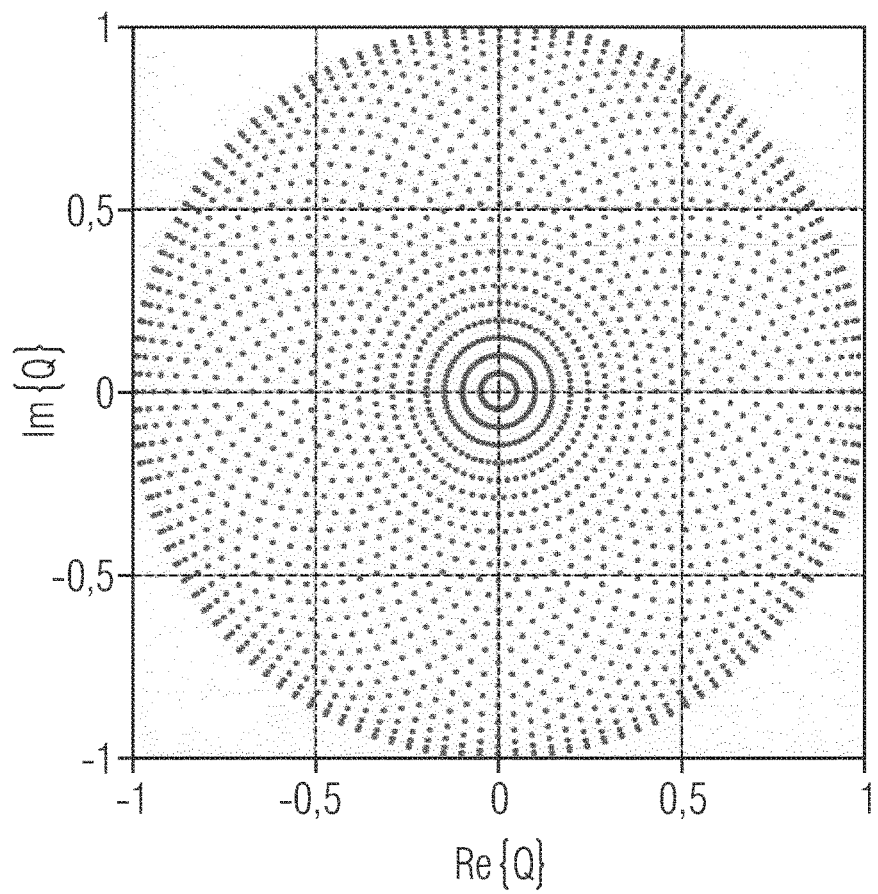
FIG. 2a shows a complex representations of an example of 2049 pulse patterns in I and Q.

One method to encode a complex baseband signal to a binary pulse sequence is to map a carrier frequency $f_c$ to a pulse repetition rate, a phase of the complex baseband signal to the pulse position and an amplitude of the complex baseband signal to the pulse width and/or pulse density. In a synchronous digital system the pulses can be quantized based on a time grid of an output (bit) rate $f_{out}$ of a digital signal processing circuit. FIG. 1 shows an example of a wanted RF waveform r(t) and a corresponding digital output sequence y(t). In the displayed case, $f_{out}$ is eight times higher than a desired carrier frequency $f_c$ of the RF signal (N=8). Note that the $f_c$ may also be understood as center frequency of the RF signal as the traditional notion of an analog carrier signal is not really applicable to the all-digital RF signal generation presented herein. The example of N=8 leads to $M=N^2/2+1=33$ different possible pulse sequences, if we only use one pulse per carrier period $T_c$ (=1/$f_c$) and only pulse width up to 50% duty cycle. The corresponding complex baseband value for a hypothetical pulse sequence can be calculated by correlation according to $$c_1 = \frac{1}{T} \int_0^T y(t)e^{-2\pi j f_c t} dt, \quad (1)$$

wherein T represents the duration of the complex baseband value or sample. Thus, another interpretation for the carrier frequency $f_c$ would be the frequency or rate that is used for the correlation according to Eq. (1). All possible baseband values together form the matrix Q, which is used for quantization. An exemplary quantization matrix is plotted in FIG. 2a for N=64.

Eq. (1) can be transformed in the case of a single pulse within $T_c$ to the following using $D_\alpha = \alpha/T_c = D_\gamma - 1/2D$, $D_\beta = \beta/T_c = D_\gamma + 1/2D$ and $D = D_\beta - D_\alpha$. D is the ratio of the pulse width to the carrier period, $D_\alpha$ the relative timing of the rising edge, $D_\beta$ the relative timing of the falling edge and $D_\gamma$ the relative pulse center as depicted in FIG. 1.

$$q_m = \underbrace{\frac{\sqrt{2}A}{\pi}\sin(\pi D)}_{Amplitude} \underbrace{e^{-2\pi j D_\gamma}}_{Phase}$$

$$Q = \{q_1, q_2, \ldots, q_M\}$$

Figure 2B:
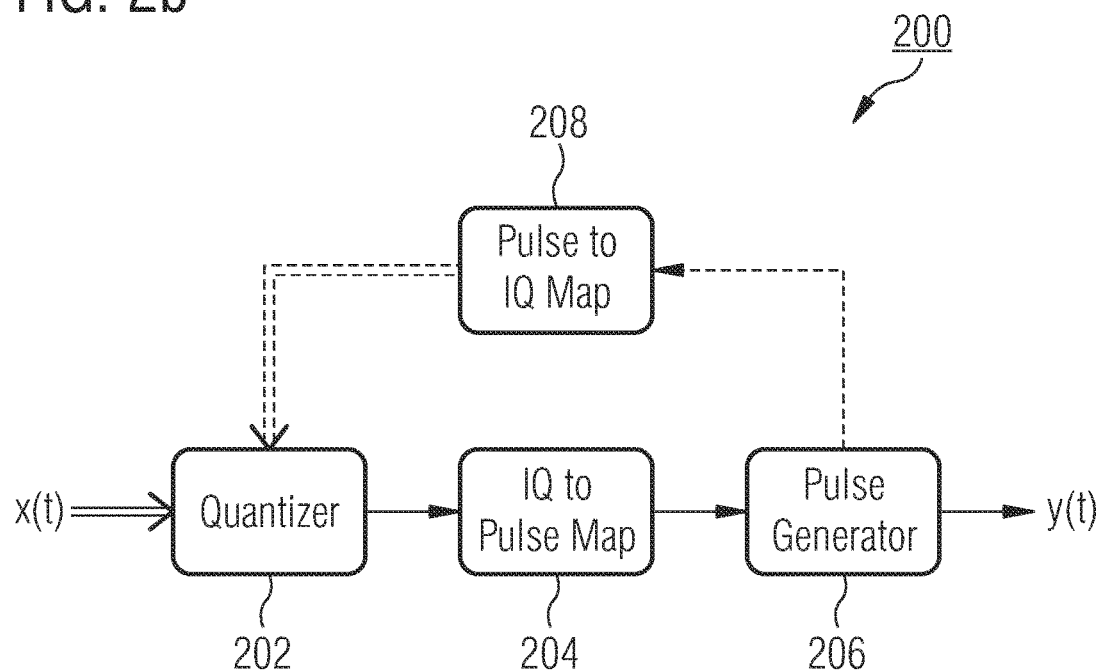
FIG. 2b shows a block based diagram of an example of the proposed encoder architecture.

The (baseband) input signal x(t) of the quantizer 202 shown in the example architecture 200 of FIG. 2b is mapped to the closest value of the Q matrix. Each matrix entry can be linked to a corresponding predefined (modulated) pulse pattern centered at $f_c$ and the output signal y(t) centered at $f_c$ is generated at output clock rate $f_{out}$ by pulse generator 206. Due to the fact that the time resolution (e.g., output rate $f_{out}$) is always finite, this mapping between baseband signal and corresponding pulse pattern equals a temporal quantization of pulses.

Figure 3:
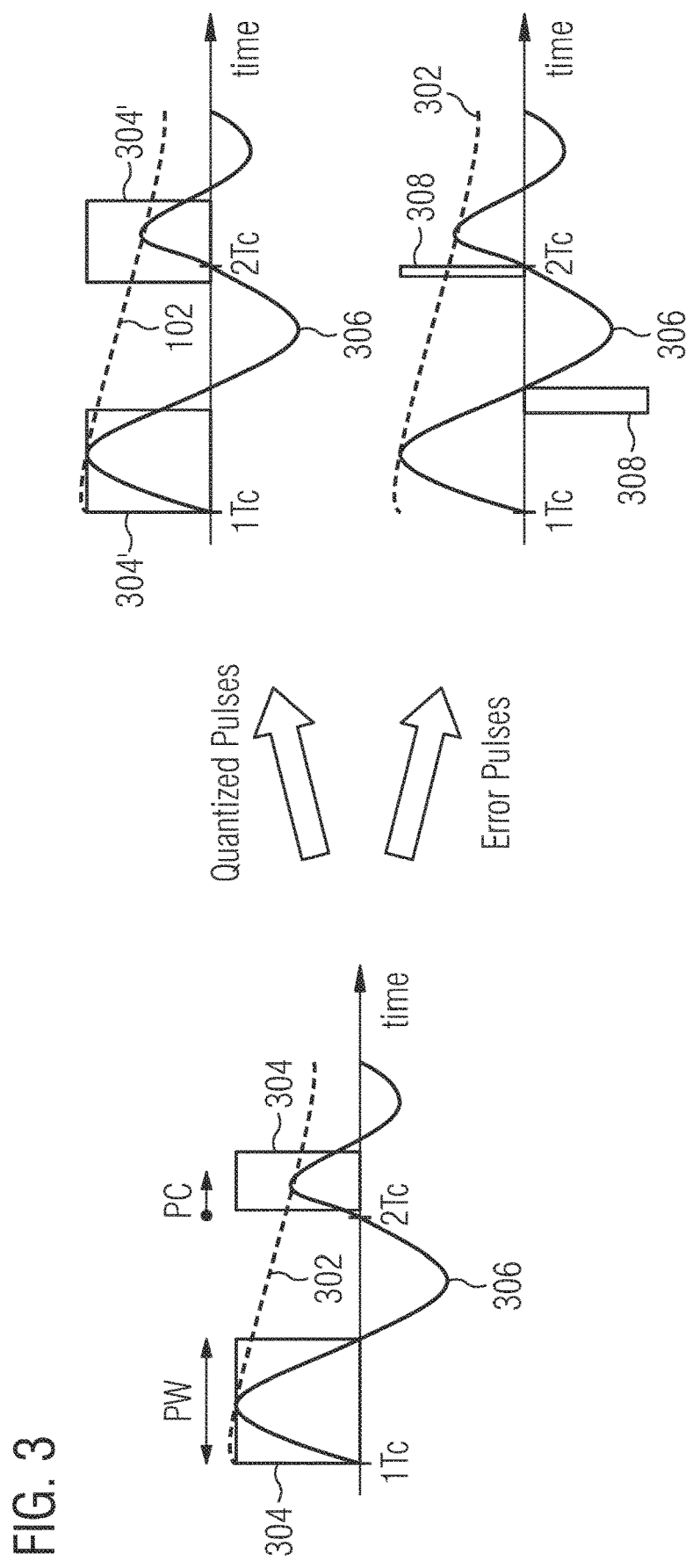
FIG. 3 illustrates the concept of pulse quantization to due to discrete values.

This quantization effect is illustrated in FIG. 3. Assuming an infinitely high output rate $f_{out}$, a baseband input signal 302 would be encoded to pulses 304, leading to the desired output signal 306. In real-world scenarios the output rate $f_{out}$ and thus the time resolution of an all-digital architecture is limited, which leads to quantized pulses 304' in response to the baseband input signal 302. The difference between pulses 304 and quantized pulses 304' can be interpreted as error pulses 308 (quantization errors), leading to amplitude and phase errors. The quantization error is correlated with the wanted signal, if the time resolution (bit rate) is low. This reduces the SNR (Signal to Noise Ratio), especially close to the wanted carrier or center frequency $f_c$. However, the SNR close to the carrier or center (called ACP (Adjacent Channel Power) or ACLR (Adjacent Channel Leakage Power Ratio)) is a crucial figure of merit in communication systems.

Figure 4A:
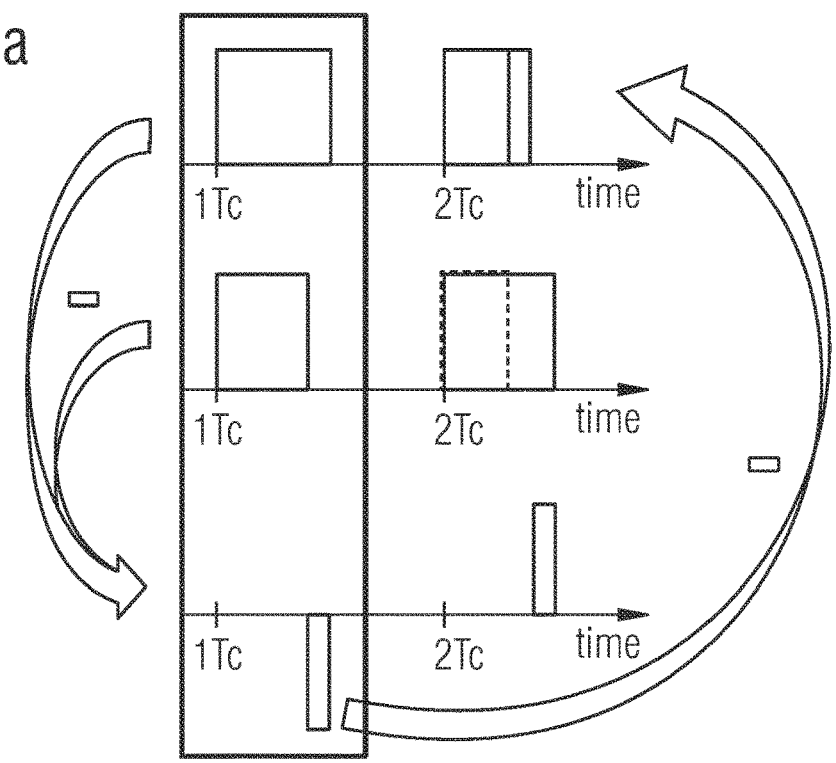
FIG. 4a shows the principle behind RF-PWM with DSM.

One conventional way to reduce this error is illustrated in FIG. 4a. Here, the generated error per pulse can be calculated or measured and accounted for in the next pulse. This is what is basically done in Delta-Sigma-Modulation (DSM). A DSM uses a feedback signal to account for the quantization error caused by the finite time resolution. By proper design and weighting of one or more feedback signals, the quantization noise can be pushed away spectrally from the carrier frequency. This leads to better ACLR values even though the total quantization noise is not reduced. However, this concept requires the execution of multiple logical operations within one carrier period $T_c$, making online processing with live data at high frequencies difficult or even impossible.

Figure 4B:
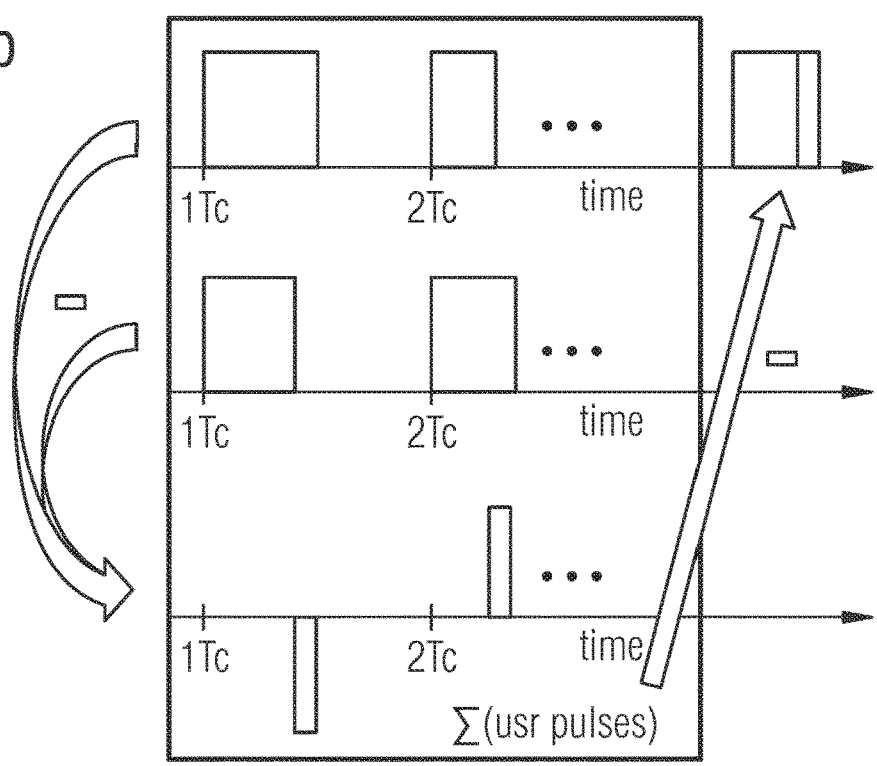
FIG. 4b shows the principle behind undersampled DSM.

One way to make this concept practicable for cost-effective implementations is to over-come the limit to one pulse per carrier period, which is shown in FIG. 4b. Here, a block wise error calculation is performed. Instead, of compensating for each pulse individually, multiple pulses are compensated "in average". Although feedback is still required, the required processing speed reduces significantly, e.g. handling ten carrier periods in one baseband cycle reduces the required clock rate from the carrier frequency of 2 GHz to 200 MHz. Such rates can be realized using off the shelf Field Programmable Gate Arrays (FPGAs). The concept of handling multiple carrier cycles in one baseband cycle will be also referred herein as "undersampling".

Thus, the technical problem with the pure PWM solution is that the ACLR is too low, at least for mobile communication applications, at realistic bit rates. The technical problem with the PWM plus DSM solutions is the timing requirements for the feedback path. For good noise shaping, meaning a good ACLR, the feedback loop has to be closed with a very short delay. The best results are achieved with a feedback at carrier clock rate $f_c$. This is difficult to realize in FPGAs or ASICs even for the simplest DSM structures (1$^{st}$ order DSM). More complex DSM structures are advantageous but even more difficult to implement.

It has been found that the quantization error is not random but deterministic and depends on the input signal, the carrier clock rate $f_c$ and the output bit rate $f_{out}$. Thus, it is one finding to use a priori system knowledge to design the expected, average quantization error in such a way that it becomes uncorrelated with the wanted signal for extremely low timing resolution without the need for a feedback signal. An idea is to design an undersampled PWM time quantization in a way that the phase error equals out over a given period of time. The present disclosure also describes a way to implement a high-resolution PWM with low timing resolution at high carrier frequency with low processing/computing speed requirements. To understand how this works, we take a look into pulse width modulation and its output spectrum. We will explain the process using the wanted signal, however, this ex-planation is also valid for the quantization error as described later.

Figure 5:
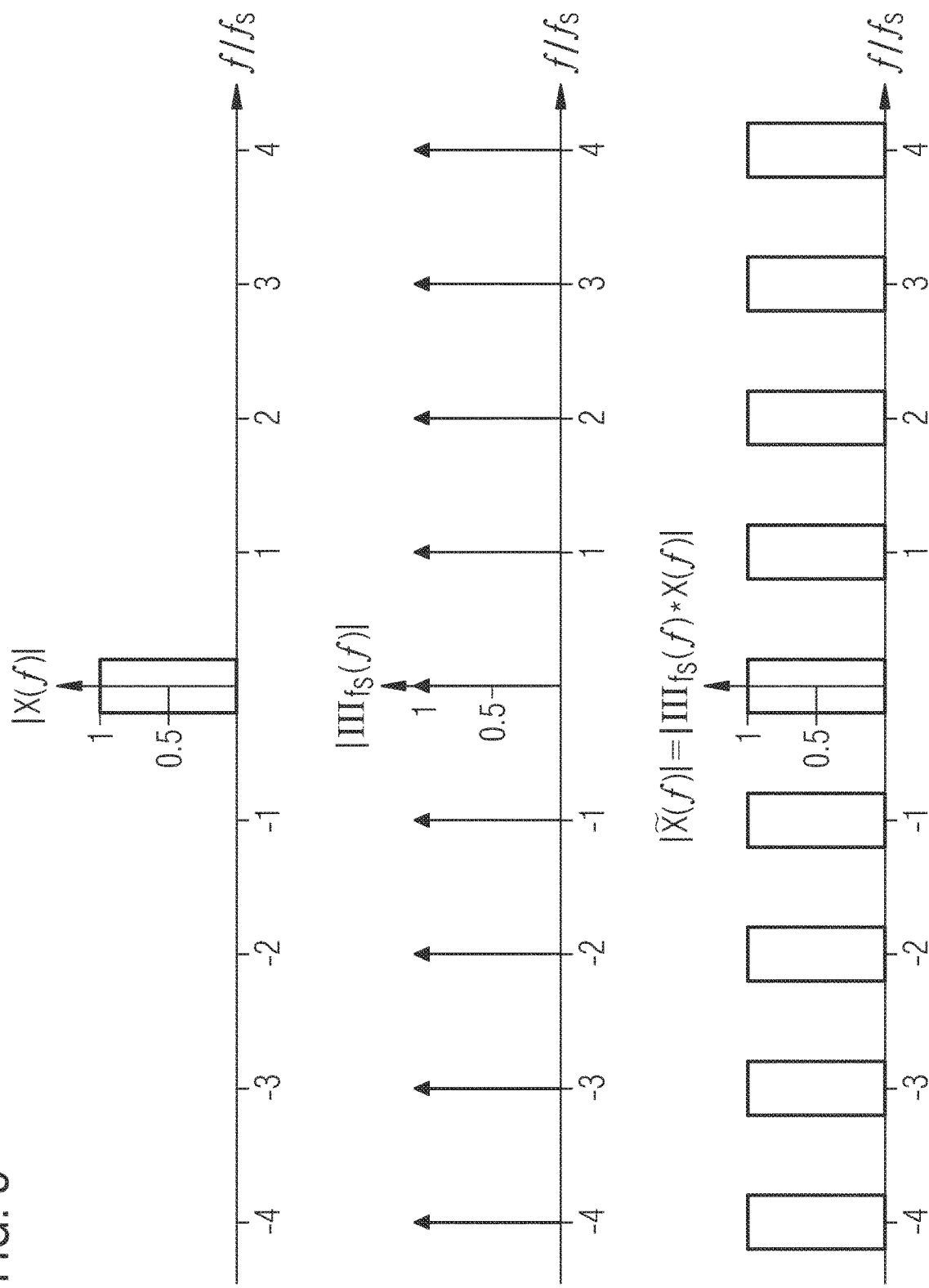
FIG. 5 shows the ideal spectrum of a baseband signal sampled at 295 MHz sampling rate.

We start with an ideal BB (baseband) signal of an example sampling rate $f_s$=295 MHz in the spectral domain X(f), see FIG. 5. When we up-sample this signal for example by times nine using zero insertion method to carrier frequency 2655 MHz $f_c$, we get replicas in the spectral domain at all multiple frequency of $f_s$. The resulting signal is shown in as $\tilde{X}(f)$ in FIG. 5. In addition to this effect we have a ZOH (Zero-Order-Hold) effect due to holding the value of x(t) constant over the baseband sampling period of $T_s$. This is equal to win-dowing with rectangle of width $T_s$ which results in a sinc-function in the spectrum with zeros at multiples of $f_s$. In an unmodulated case this eliminates all harmonics, however, for a modulated signal, there are "left-overs" at multiples of $f_s$ as shown in FIG. 6.

Now there can be a third aliasing effect due to the PWM operation as shown in FIG. 7. The amplitude is represented by the width of the pulses and the phase by shifting the pulse. The repetition rate of the pulses is the carrier frequency $f_c$. As such, a spectrum as shown in FIG. 7 is generated. It has harmonics at multiples of $f_c$, tendentially declining over frequency. Exact phase and amplitude of the harmonics depend on the input amplitude and phase values. In the special case when $f_c=N_1*f_s$ ($f_c$ is the carrier frequency, $f_s$ the update or clock rate of the BB signal and $N_1$ is the integer multiple $f_c/f_s$), the harmonics of the PWM fall on top of the harmonics of the sampling/ZOH spectrum.

Figure 8:
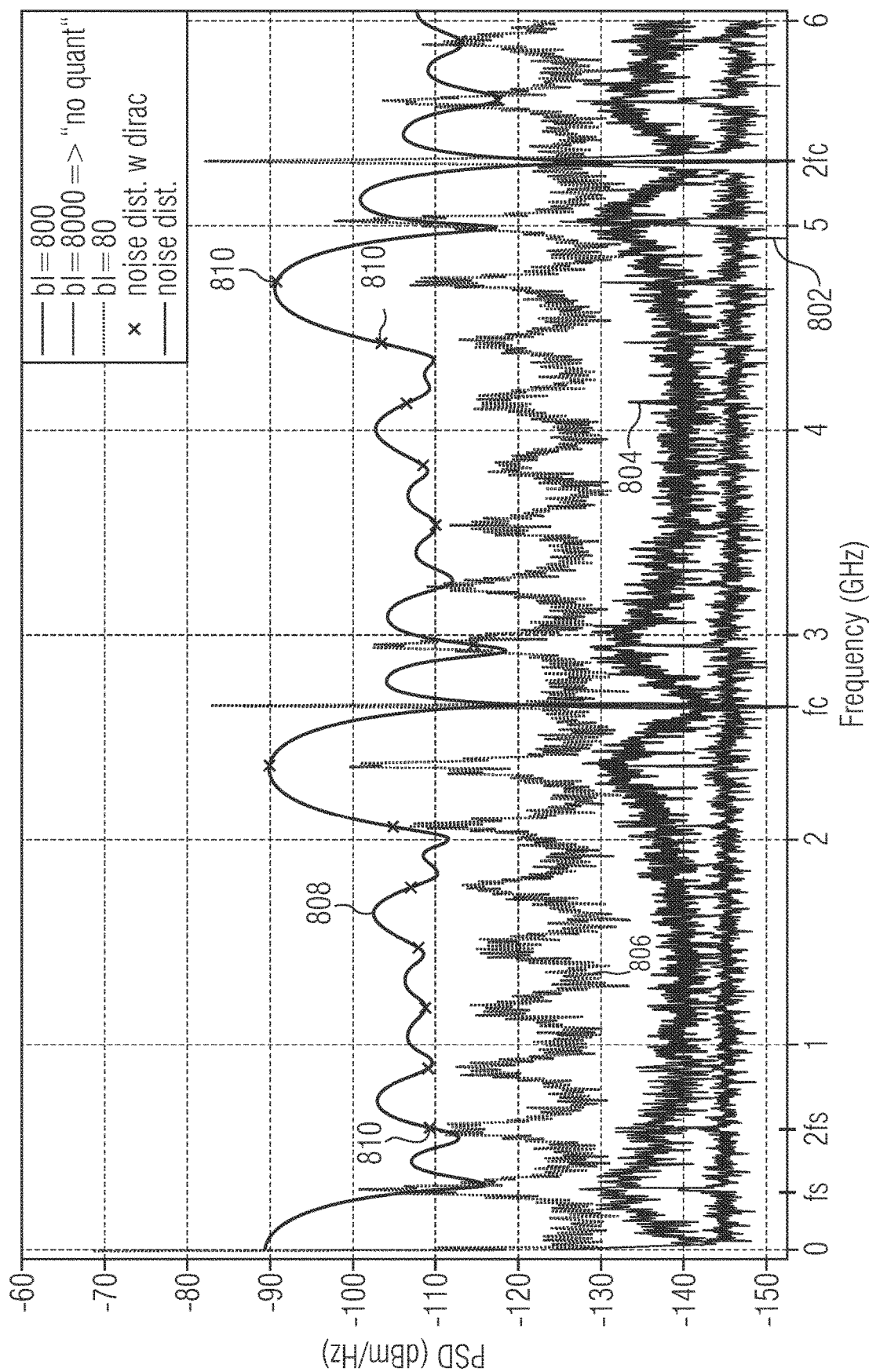
FIG. 8 shows various PWM output spectra for different ratios of input and output rates.

This leads to a spectrum as shown in FIG. 8 as curve 802 with following parameters:

BB rate: $f_s$=295 MHz
$N_1$=9
carrier frequency: $f_c=N_1*f_s$=2655 MHz
output block length: $N_2$=8000
Bit rate: $f_{out}=f_s*N_2$=2360 GS/s In this case, the output block length ($N_2$) and therefore the output bit rate $f_{out}$ is so high that the quantization error is negligible. The replicas of the sampling operation are visible spaced with the baseband sampling frequency $f_s$ of 295 MHz. They are decreasing with the frequency up to half of the carrier frequency $f_c$. After that, the replicas are increasing again. This is caused by the superposition of the lower replicas due to the PWM operation. The dominant wanted signal at $f_c$ is covered by the other curves 804, 806, 808, having the same Power Spectral Density (PSD) at the carrier frequency $f_c$.

Figure 9A:
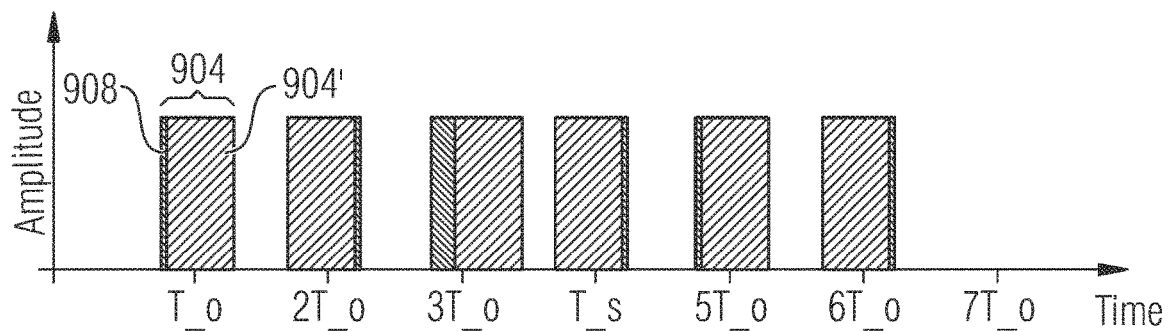
FIG. 9a, b illustrate error pulses due to quantization.
Figure 9B:
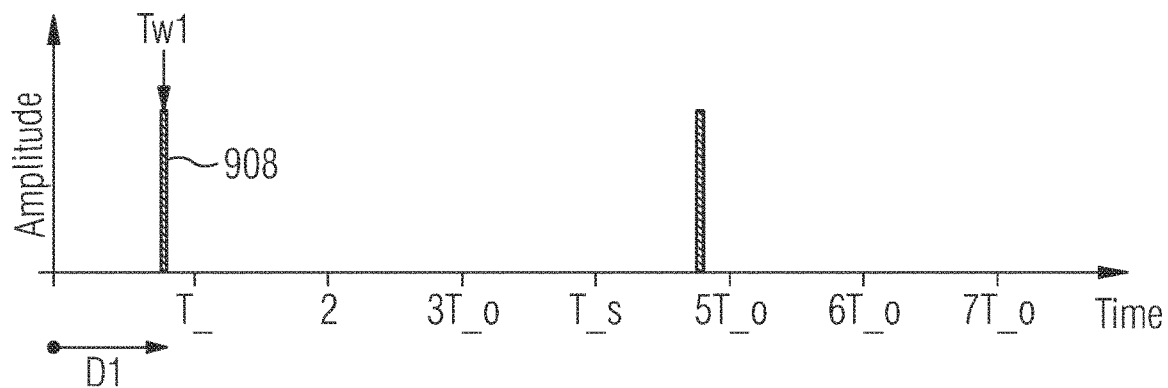

Now we want to look at the impact of a lower timing resolution, i.e., a lower output clock rate $f_{out}$, and therefore at the quantization error. The impact of quantization can be schematically seen in FIG. 9a. The pulses 904 composed by pulses 908 and pulses 904' shoulder to shoulder are ideal ones, while the pulses 904' show the quantized pulse (exaggerated depiction). The pulses 908 can be called "quantization pulses" or "error pulses". The quantization pulses 908 can be described mathematically as follows. FIG. 9b shows an example error pulse 908. It has a width $T_{w1}$ and a time shift of D1.

The output spectrum of the quantization pulses 908 can be calculated as follows. At a later point, all $T_w$'s are assumed to be equal, this simplification is ok because the influence of the error pulse width is only minor at higher frequencies (for $T_w \ll T_c$). However, the contribution of the phase of the quantization pulse 908 has larger influence on the error spectrum.

Assuming constant $T_w$:

$$x = \frac{T_w}{T_c}$$

-continued $$P(f) = xT_c \text{sinc}(fxT_c) \sum_{n=1}^{N_1} e^{j\phi_n(t)\frac{f}{f_c}+j(n-1)2\pi\frac{f}{f_c}}$$

$$S(f_c) = \frac{x}{N_1} \sum_{n=1}^{N_1} e^{j\phi_n(t)}$$

For the special case at the (desired) carrier frequency $f_c$ (see $S(f_c)$ in the equations) we can see that the quantization error at $f_c$ is nulled if the sum of the phases of the quantization pulses 908 is zero. This effect can clearly be seen in curve 804 of FIG. 8. It shows a deep notch around the carrier frequency $f_c$. At other frequencies the quantization noise is distributed as shown by curve 808. However, note that curve 808 would only be 100% valid for the assumption of a static pulse width $T_w$ of the error pulses. For a modulated signal the spectral density is different, but the static assumption already leads to good results as proven by simulation.

The wideband spectral distribution of the error power is visualized by curve 808 in FIG. 8 for an exemplary static pulse width. It is superimposed by the ideal signal spectrum as represented by curve 802. When the error signals becomes modulated the spectrum becomes more evenly distributed as shown by curve 804. Yet, the noise notch is still clearly visible.

With lower timing resolution ($N_2$=80 equals 23.6 GS/s), the noise power increases. At the same time, the quantization error becomes more periodic with $f_s$ instead of $f_c$. The input signal can be regarded quasi constant over a long period of time. Now we choose the output clock rate $f_{out}$ compared to the carrier frequency $f_c$ in a way that every pulse is subject to a different quantization. However, this is periodic with the baseband clock rate $f_s$. This means that every first pulse of each baseband sampling block is quantized in the same way. The second pulse is also always quantized in the same way, however, differently from the all other pulses in the baseband sampling block. Since the input signal is quasi constant the errors are repeated every $T_s$ leading to an accumulation of the error power at multiples of $f_s$. This effect can be approximately described mathematically by a Dirac comb $$r(t) = \sum_{k=-\infty}^{\infty} \delta(t-k*T_s)$$

$$R(f) = f_s \sum_{k=-\infty}^{\infty} \delta(f-k*f_s).$$

This is shown in FIG. 8 by the crosses 810. This effect becomes more dominant for low timing resolutions because the quantization error becomes more correlated. Again, for a modulated signal the error will slightly vary so that the result is not a perfect Dirac comb but blurred noise accumulations around multiples of $f_s$.

Thus, an advantageous noise distribution can be achieved by choosing a time quantization that leads for a quasi constant (baseband) input signal to a phase error that equals out over a period of $T_s$. It has been found that this can be achieved when a ratio between a first number $N_1$ of carrier clock cycles $T_c$ corresponding to one baseband clock cycle $T_s$ and a second number $N_2$ of output clock cycles $T_{out}$ corresponding to one baseband clock cycle $T_s$ is non-integer. Also, $N_1<N_2$. Examples of non-integers include decimals or fractions.

Thus, embodiments aim at a concept for generating at least one RF signal, wherein at least one digital baseband signal is received or generated at a baseband (or processing) clock rate $f_s$. At least one digital pulse sequence at a carrier clock rate $f_c$ substantially corresponding to a carrier or center frequency of the RF signal based is modulated on the digital baseband signal. Pulses of the pulse sequence are quantized based on a time grid of an output clock rate $f_{out}$. A ratio between a number $N_1$ of carrier clock cycles corresponding to one baseband clock cycle and a number $N_2$ of output clock cycles corresponding to one baseband clock cycle is non-integer. In other words, ratio between the output clock rate $f_{out}$ (which can be an integer multiple of the baseband clock rate $f_s$) and the carrier clock rate or frequency $f_c$ (which can also be an integer multiple of the baseband clock rate $f_s$) is non-integer.

Figure 10:
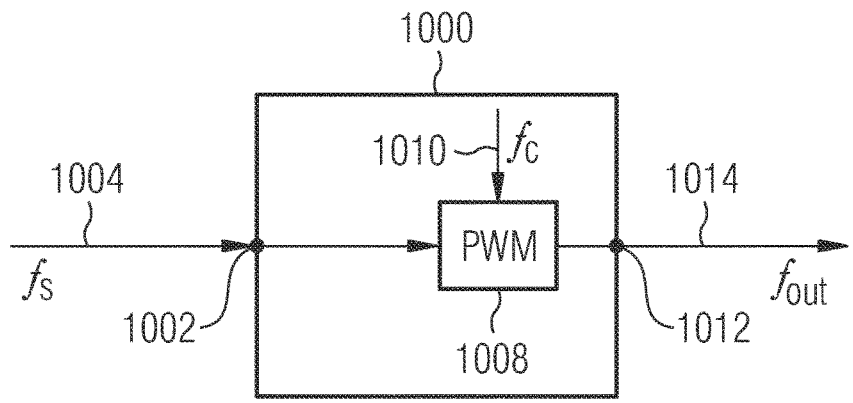
FIG. 10 shows a block diagram of an apparatus according to an example embodiment.

Turning now to FIG. 10, it is shown a schematic block diagram of an apparatus 1000 comprising an input 1002 for at least one (complex) digital baseband signal 1004 sampled at a first clock rate $f_s$. The apparatus 1000 comprises a processor 1008 (for digital signal processing) and possibly associated memory which is configured to modulate at least one digital pulse sequence 1010 around a second clock rate $f_c$ based on the digital baseband signal 1004. Furthermore, the processor or modulator 1008 is configured to quantize widths and/or positions of pulses of the pulse sequence 1010 based on a time grid of a third clock rate $f_{out}$. Processor 1008 can be configured to map a phase of the (complex) baseband signal 1004 to one or more pulse positions in the time grid of the third clock rate $f_{out}$ and to map an amplitude of the (complex) baseband signal 1004 to one or more pulse widths and/or densities in the time grid of the third clock rate. Thereby a ratio between a first number $N_1$ of second clock cycles corresponding to one first clock cycle and a second number $N_3$ of third clock cycles corresponding to one first clock cycle is non-integer. The apparatus 1000 further comprises an output 1012 for the modulated digital pulse sequence 1014 (corresponding to a modulated digital carrier signal) sampled at the third clock rate $f_{out}$.

Input 1002 and/or output 1012 can be any input/output (I/O) means for communicating between apparatus 1000, such as a general purpose processor or dedicated integrated circuit, and the outside world, e.g. another information processing system. As such, input 1002 and/or output 1012 can be understood as interfaces across which two separate components of a system can exchange information. The exchange can be between software, hardware, peripheral devices, or combinations of these. Hardware examples of input 1002 and/or output 1012 are I/O pins (e.g., General-purpose input/output (GPIO) pins) or I/O connectors, such as plugs or jacks. As mentioned before, input 1002 and/or output 1012 can also be pure software interfaces, such as programming interfaces, in other examples.

In some embodiments, the apparatus 1000 or parts thereof can be implemented by means of a high-speed FPGA, for example. The apparatus 1000 can be implemented according to the architecture of FIG. 2b, for example. That is to say, the (complex) digital baseband signal 1004 is input to a quantizer 202 to map it to the closest value of the Q matrix. This closest value can then be mapped to one of a plurality predefined output pulse patterns to generate the modulated digital pulse sequence 1014.

Figure 11:
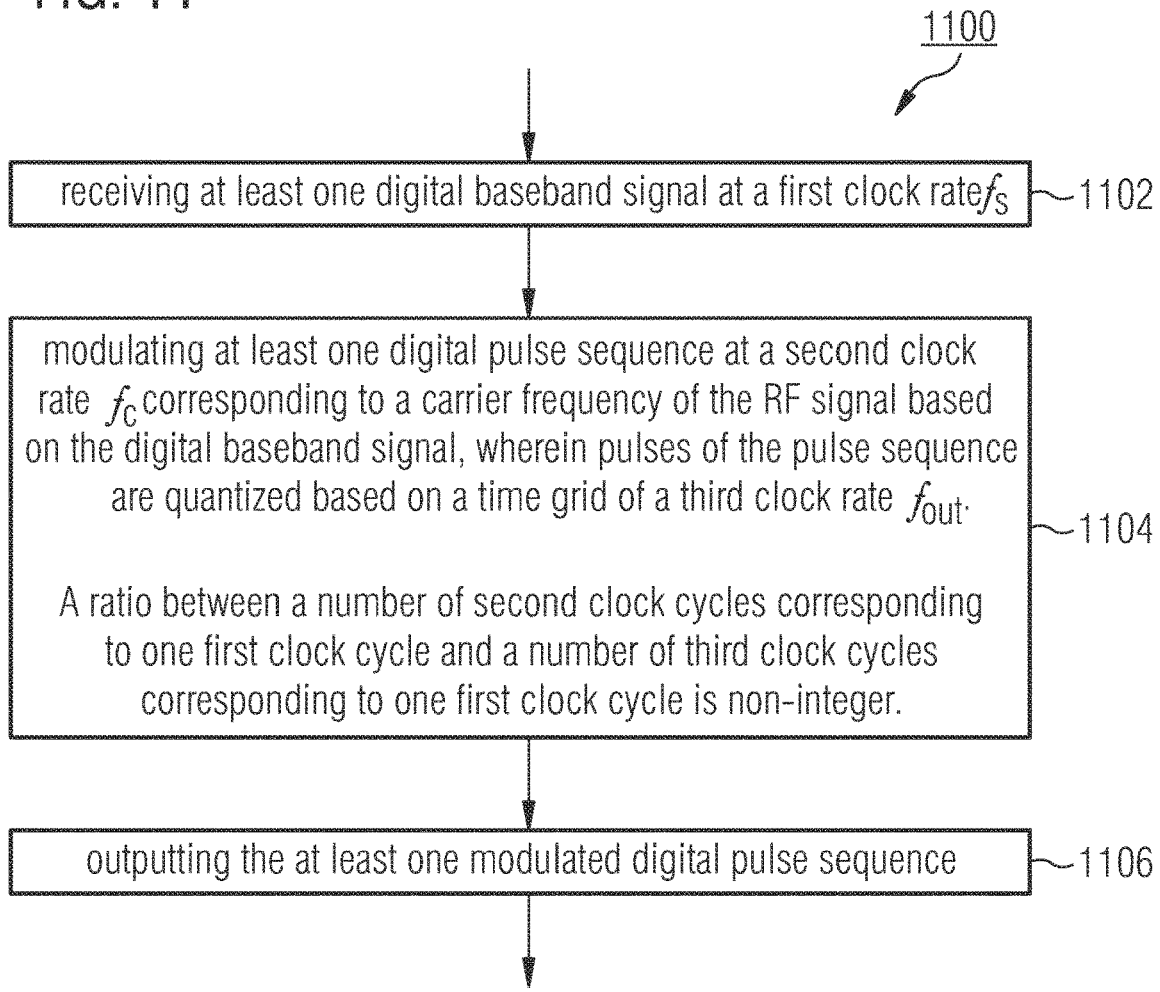
FIG. 11 shows a flowchart of a method according to an embodiment.

The skilled person having benefit from the present disclosure will appreciate that the apparatus 1000 can also perform a corresponding RF signal generation method while oper-ative. A flow chart of such a method 1100 for digitally generating a digital RF signal is shown in FIG. 11.

Method 1100 includes an act of receiving 1102 at least one digital baseband signal at a first clock rate $f_s$. In act 1104, at least one digital pulse sequence at a second clock rate $f_c$ substantially corresponding to a carrier or center frequency of the RF signal is modulated based on the digital baseband signal. Note that "substantially corresponding to the carrier or center frequency" means that the second clock rate $f_c$ can be chosen within a range of ±10%, ±5%, or ±1% of the desired carrier or center frequency, for example. Pulses of the pulse sequence are quantized based on a time grid of a third clock rate $f_{out}$. A ratio between a number of second clock cycles within one first clock cycle and a number of third clock cycles within one first clock cycle is non-integer. After modulation 1104, the at least one modulated digital pulse sequence is outputted for further processing in act 1106.

Figure 12A:
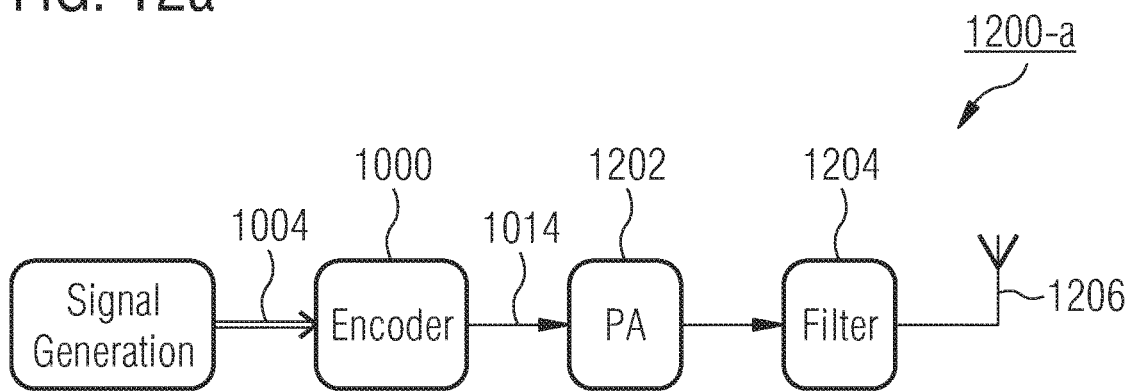
FIG. 12a shows a block diagram of an all-digital transmitter architecture according to the present disclosure. The whole RF signal generation can be implemented digitally, only the PA, filter and antenna remain analog.

As schematically shown in FIG. 12a, the modulated digital pulse sequence 1014 can then be amplified and digital-to-analog converted by an analog power amplifier 1202, for example. The amplified pulse sequence can then be filtered by an analog filter 1204 to generate an analog RF signal which can be transmitted via one or more antennas 1206. In this respect, FIG. 12a shows a block diagram of an all-digital transmitter architecture 1200-a using advanced signal processing according to the present disclosure. The whole RF signal generation can be implemented digitally, only the PA 1202, filter 1204 and antenna 1206 may remain analog.

Figure 12B:
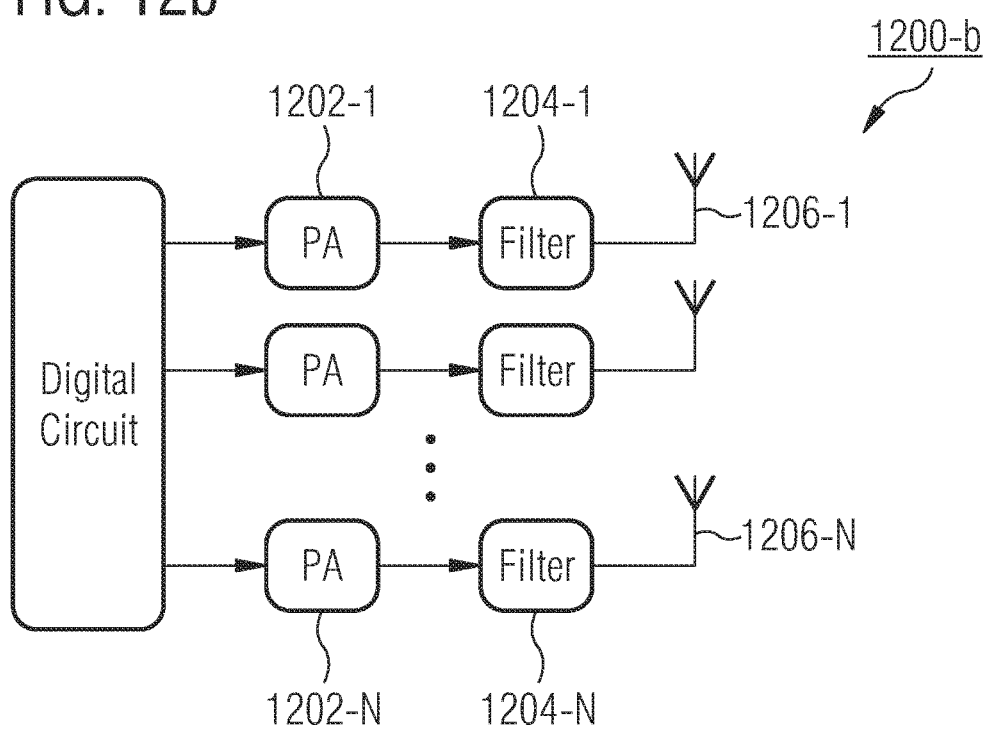
FIG. 12b shows a block diagram of an all-digital transmitter for cost-effective Massive MIMO implementations. Multiple RF signals are generated directly in the digital circuit. The binary waveforms are then amplified and filtered and thereby converted to analog waveforms.

Once implemented in a digital circuit, the transmit chain of FIG. 12a can be duplicated with low effort utilizing high-speed interfaces as RF outputs. An abstract block diagram of a MIMO transmit system 1200-b with all-digital RF signal generation is shown in FIG. 12b. Multiple (N) RF signals can be generated directly in the digital circuit. The binary waveforms are then amplified and filtered and thereby converted to analog waveforms.

Thus, the method 1100 can optionally include receiving or obtaining a first digital baseband signal at a first baseband clock rate $f_{s,1}$ and receiving at least a second digital baseband signal at a second baseband clock rate $f_{s,2}$. The baseband clock rates $f_{s,1}$ and $f_{s,2}$ can be equal or different. Pulses of a first digital pulse sequence at a first carrier clock rate $f_{c,1}$ can be modulated based on the first digital baseband signal. The pulses can be quantized based on a time grid of an output clock rate $f_{out}$. Pulses of a second digital pulse sequence at a second carrier clock rate $f_{c,2}$ can be modulated based on the second digital baseband signal. The pulses are quantized based on the time grid of the output clock rate $f_{out}$. Note that the carrier clock rates $f_{c,1}$ and $f_{c,2}$ can be equal or different. A ratio between a number of carrier clock cycles corresponding to one respective baseband clock cycle and a number of output clock cycles corresponding to one respective baseband clock cycle is again non-integer. The first modulated pulse sequence can be transmitted via a first antenna; and the at least one second modulated pulse sequence can be transmitted via a second antenna.

Let us look at the following example configuration:
BB rate: $f_s$=295 MHz
$N_1$=9
carrier frequency: $f_c=N_1*f_s$=2655 MHz
output block length: $N_2$=80
output rate: $f_{out}=f_s*N_2$=23.6 GS/s The non-integer ratio $N_2/N_1$ is a repeating or recurring decimal (8,$\overline{8}$ in the example case). Per baseband clock cycle, we generate nine pulses at carrier frequency $f_c$ with only one output block of 80 bits at frequency $f_{out}$. The nine pulses have the same amplitude and phase calculated by one baseband signal at $f_s$. However, 80 cannot be divided by nine evenly. Thus, the quantization processes for the nine pulses are different from each other.

For example, the normalized phase error for a constant input signal over the nine pulses are 0.11111 0.22222 0.33333 0.44444 −0.44444 −0.33333 −0.22222 −0.11111

Meaning that the sum over the baseband processing period $T_s$ becomes zero. The nulling of the quantization power works best at the carrier frequency $f_c$ and degrades with the frequency difference. As such, the effect decreases with the distance from $f_c$ as shown by curve 804 in FIG. 8. The skilled person having benefit from the present disclosure will appreciate that it is also possible to design the system in a way to minimize the quantization power at a different frequency.

If we chose $N_1$ to be 10 or 8, by which $N_2$=80 can be divided evenly, the quantization error for each pulse would be same and appear periodically at carrier frequency. Therefore, the mean error over $T_s$ becomes non-zero for integer ratios $N_2/N_1$.

According to the present disclosure it is proposed to use an "undersampling" rate $N_1$, by which the block length $N_2$ cannot divided evenly. It does not have to be an integer number. It can be any positive real number, with which we even observe better performance in simulation. However, with an integer number the hardware implementation becomes more feasible.

Here, another comparison of figures of merit for conventional PWM with the presented solution for very similar output bit rates:

Conventional PWM:
A1=13.6 dB, EVM=47.1%, lim_eff=62.0%, $f_c$=2655 MHz, $f_{out}$=13 Gb/s, $N_1$=5.00, $N_2$=45
A1=16.0 dB, EVM=37.1%, lim_eff=67.9%, $f_c$=2655 MHz, $f_{out}$=16 Gb/s, $N_1$=6.00, $N_2$=54
A1=19.1 dB, EVM=30.8%, lim_eff=71.2%, $f_c$=2655 MHz, $f_{out}$=19 Gb/s, $N_1$=7.00, $N_2$=63
A1=20.2 dB, EVM=26.8%, lim_eff=74.4%, $f_c$=2655 MHz, $f_{out}$=21 Gb/s, $N_1$=8.00, $N_2$=72
A1=21.3 dB, EVM=23.1%, lim_eff=76.3%, $f_c$=2655 MHz, $f_{out}$=24 Gb/s, $N_1$=9.00, $N_2$=81
A1=23.2 dB, EVM=21.0%, lim_eff=77.6%, $f_c$=2655 MHz, $f_{out}$=27 Gb/s, $N_1$=10.00, $N_2$=90

Example of Proposed Solution:
A1=40.2 dB, EVM=3.2%, lim_eff=53.3%, $f_c$=2655 MHz, $f_{out}$=13 Gb/s, $N_1$=4.89, $N_2$=44
A1=42.9 dB, EVM=2.7%, lim_eff=61.0%, $f_c$=2655 MHz, $f_{out}$=16 Gb/s, $N_1$=5.89, $N_2$=53
A1=43.4 dB, EVM=2.4%, lim_eff=66.5%, $f_c$=2655 MHz, $f_{out}$=18 Gb/s, $N_1$=6.89, $N_2$=62
A1=46.8 dB, EVM=2.0%, lim_eff=70.6%, $f_c$=2655 MHz, $f_{out}$=21 Gb/s, $N_1$=7.89, $N_2$=71
A1=48.2 dB, EVM=1.8%, lim_eff=73.4%, $f_c$=2655 MHz, $f_{out}$=24 Gb/s, $N_1$=8.89, $N_2$=80
A1=49.0 dB, EVM=1.7%, lim_eff=75.2%, $f_c$=2655 MHz, $f_{out}$=26 Gb/s, $N_1$=9.89, $N_2$=89

One can easily see the huge improvement in ACLR1 (A1) and EVM only by choosing an advantageous timing resolution.

Figure 13:
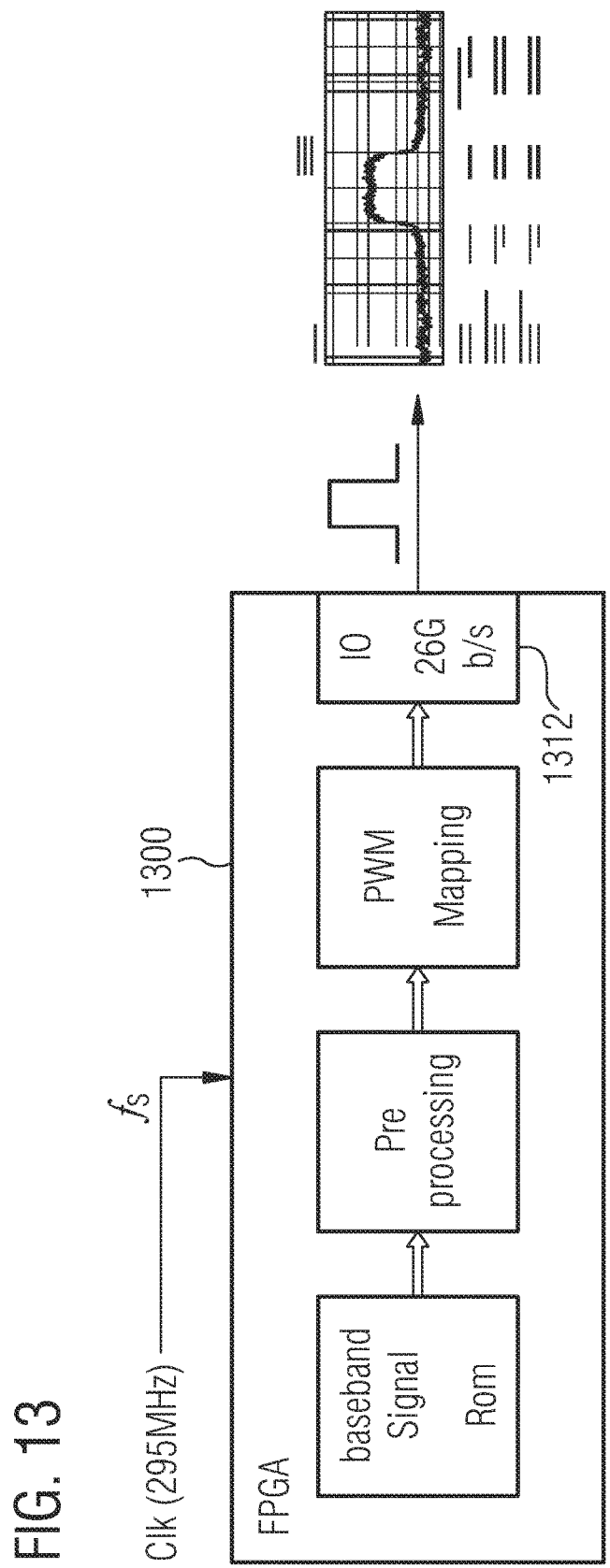
FIG. 13 illustrates a test setup with FPGA and spectrum analyzer.

Solutions based on DSM and PWM need a DSM running at carrier frequency $f_c$, which can at present only be realized in an IC with very expensive technologies. One advantage of the proposed approach is the feasibility of hardware implementation with conventional FPGAs on the market. The proposed approach can be implemented in a conventional FPGA with high speed IOs. For hardware testing a spectrum analyzer can be directly con-ducted on the FPGA output pins as shown in FIG. 13. In this test example, a fractional part of a UMTS frame having a bandwidth of 5 MHz is stored in an FPGA 1300 and the high speed IO 1312 is running at 26 Gbits/s. In the test we can see that the ACLR is about −43 dBcm because the signal sequence stored on FPGA is too short. With a longer signal we expected at least 3 dB ACLR improvement. Furthermore, about 500 MHz frequency band around the RF signal is clean.

Also at very high frequencies, the RF signal can be synthesized in a very linear manner (over 45 dB ACLR1). As an example, we show a 5 MHz signal at roughly 11 GHz carrier frequency. The following example settings can be used:

BB rate: $f_s$=295 MHz
$N_1$=37;
carrier frequency $f_c$=$N_1$*$f_s$=10915 MHz
output block length: $N_2$=79
Bit rate: $f_{out}$=$f_s$*$N_2$=23.3 GS/s
$N_2/N_1$=2,1351.

The noise distribution depends on the "frequency of the average error", i.e., the average quantization error over $T_s$. Meaning that for input signals with a signal BW<<$f_s$, the time period of the majority of the quantization error is deterministic to a great extend. For example, if we design the system frequencies according to $$(x*N_1-N_{avg})*f_s=f_{out}, \text{ e.g. with } N_{avg}=[1,\ldots,N_1-1]$$
$$\text{and } x>1, \text{ i.e., } N_2=(x*N_1-N_{avg}),$$

then the average quantization phase error equals out over one period of $T_s$. This implies that quantization error accumulates mostly at $f_c\pm f_s$, also visible in FIG. 14 as curve 1402. This is already an improvement compared to conventional approaches which is shown as curve 1404 ($N_{avg}$=0).

However, embodiments can push the noise even further by increasing $N_{avg}$. For example, $N_{avg}$=2 leads to an accumulation of the noise power at $f_c\pm 2f_s$, see curve 1406. This can be advantageous for filter requirements or filter implementation.

The above equation $(x*N_1-N_{avg})*f_s=f_{out}$ can also be written as $f_{out}=x*N_1*f_s-N_{avg}*f_s=x*f_c-N_{avg}*f_s$. Thus, if x=a and $N_{avg}$=b, then $f_{out}=a*f_c-b*f_s$, with a∈ℕ⁺, and b∈ℤ\{0}. In Note that one or more of the parameters $N_1$, $N_2$, a, b, center frequency ($f_c$) could be stored in a (computer) memory accessible by the processor 1008. One or more of the parameters can be variable or adjustable. Also, one or more of the parameters can differ for different transmit paths of a MIMO system, for example.

The proposed concept can be a game changer for signal generation. It can enable a universal way of generating RF signals with digital means. A comparable simple computation of bit patterns can replace the classical transmitter chain composed of Digital-to-Analog Converter (DAC), Alias-Filter, Mixer+Local Oscillator (carrier frequency). As such, it can be applied wherever a simple transmit chain is needed. A beneficial scenario is when a high speed digital circuit is required anyway, for example for baseband signal generation. Even though some examples here have been elaborated for a 5 MHz LTE signal, the concept can be regarded standard agnostic. Any communication signal can be synthesized. Generally, the SNR scales inversely to the BW meaning that a higher BW leads to lower ALCR values. However, higher carrier frequencies are to some extend beneficial so that carrier frequency ranges from close to DC up to halve of the output bit rate can be generated with roughly similar SNR performance.

Also, the proposed concept can scales very well with new technologies. Simulations show that doubling the bit rate leads to 6 dB increase in ACLR. Consequently, many applications can be covered in the future which have to stringent requirements for the today's technol-ogy.

An application for the proposed concept can be Massive MIMO. Instead of a full transmit chain for every transceiver one FPGA using the explained concept can feed a whole antenna array. In such scenario there are multiple instances of the described encoding scheme implemented in an FPGA. The bit stream can be handed to a Multi-Gigabit-Transceiver (MGT). The output of the MGT can be connected with a coaxial RF cable to the analog Front-End. This Front-End can be composed of an amplifier, filter and antenna. In the simplest scenario the Front-End can only be a narrow-band antenna.

Some examples have been described based on binary output patterns. Instead of increasing the bit rate to improve SNR one can also combine multiple binary bit streams (in digital or analog domain) and/or generate multi-level bit streams directly.

At least parts of the above described radio communications network including base stations could be implemented using network functions virtualization (NFV). NFV is a network architecture that makes use of technologies of computer virtualization. Entire network equipment like base stations or parts thereof or part of their functions can be virtualized using software building blocks that may connect, or interact, to create communication services. A virtualized network function of e.g. a base station may include at least one virtual machine running different software and processes, on top of standard high-volume servers, switches and storage, or a cloud computing infrastructure, instead of having customized hardware appliances for each network function. As such a base station function may be implemented using a computer program product embodied on a non-transitory computer readable medium (M) for performing operations, wherein the computer program product comprises instructions, that when executed by a processor (Pr), perform the operations of the specific base station function.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inven-tor(s) to furthering the art, and are to be construed as being without limitation to such specifically recited examples and conditions. Moreover, all statements herein reciting principles, aspects, and examples of the invention, as well as specific examples thereof, are intended to encompass equivalents thereof.

Functional blocks shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks may be provided through the use of dedicated hardware, such as "a processor", "a controller", etc. as well as hardware capable of executing software in association with appropriate software. Moreover, any entity described herein as functional block, may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, Digital Signal Processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Simi-larly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other examples may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some examples a single step may include or may be broken into multiple sub steps. Such sub steps may be included and part of the disclosure of this single step unless explicitly excluded.

The invention claimed is:

1. Method for generating at least one RF signal, the method comprising:
receiving at least one digital baseband signal at a first clock rate;
modulating, based on the digital baseband signal, at least one digital pulse sequence at a second clock rate corresponding to a center frequency of the RF signal, wherein modulating the digital pulse sequence comprises quantizing pulses of the digital pulse sequence based on a time grid of a third clock rate,
wherein a ratio between a number of second clock cycles at the second clock rate corresponding to one first clock cycle at the first clock rate and a number of third clock cycles at the third clock rate corresponding to one first clock cycle is non-integer; and outputting the at least one modulated digital pulse sequence.

2. The method of claim 1, wherein the second clock rate is a first multiple of the first clock rate and wherein the third clock rate is a second multiple of the first clock rate higher than the first multiple.

3. The method of claim 1, wherein the modulating the digital pulse sequence comprises:

mapping a phase of the baseband signal to one or more pulse positions in the time grid of the third clock rate, and/or mapping an amplitude of the baseband signal to one or more pulse widths and/or densities in the time grid of the third clock rate.

4. The method of claim 1, wherein the first, second, and third clock rates are set according to $$f_3 = a * f_2 - b * f_1$$

wherein $f_1$ denotes the first clock rate, $f_2$ denotes the second clock rate, $f_3$ denotes the third clock rate, $a \in \mathbb{N}^+$, and $b \in \mathbb{Z} \setminus \{0\}$.

5. The method of claim 1, further comprising receiving a first digital baseband signal at a first baseband clock rate;

receiving at least a second digital baseband signal at a second baseband clock rate;

modulating pulses of a first digital pulse sequence at a first carrier clock rate based on the first digital baseband signal, wherein the pulses of the first digital pulse sequence are quantized based on a time grid of an output clock rate;

modulating pulses of a second digital pulse sequence at a second carrier clock rate based on the second digital baseband signal, wherein the pulses of the second digital pulse sequence are quantized based on the time grid of the output clock rate, wherein a ratio between a number of carrier clock cycles corresponding to one respective baseband clock cycle and a number of output clock cycles corresponding to one respective baseband clock cycle is non-integer.

6. A non-transitory computer-readable medium storing instruction, which when executed on a programmable hardware device configure the programmable hardware device to perform the method of claim 1.

7. An apparatus for generating at least one RF signal, the apparatus comprising:

an input configured to receive at least one digital baseband signal at a first clock rate;

a processor configured to modulate, based on the digital baseband signal, at least one digital pulse sequence at a second clock rate corresponding to a center frequency of the RF signal, wherein the processor is configured to quantize pulses of the digital pulse sequence based on a time grid of a third clock rate, wherein a ratio between a number of second clock cycles at the second clock rate corresponding to one first clock cycle at the first clock rate and a number of third clock cycles at the third clock rate corresponding to one first clock cycle is non-integer; and an output configured to output the at least one modulated digital pulse sequence.

8. The apparatus of claim 7, wherein the apparatus is configured to set the second clock rate as a first multiple of the first clock rate and to set the third clock rate as a second multiple of the first clock rate higher than the first multiple.

9. The apparatus of claim 7, wherein the processor is configured to map a phase of the baseband signal to one or more pulse positions in the time grid of the third clock rate, and/or to map an amplitude of the baseband signal to one or more pulse widths and/or densities in the time grid of the third clock rate.

10. The apparatus of claim 7, wherein the apparatus is configured to set the first, second, and third clock rates according to $$f_3 = a * f_2 - b * f_1$$

wherein $f_1$ denotes the first clock rate, $f_2$ denotes the second clock rate, $f_3$ denotes the third clock rate, $a \in \mathbb{N}^+$, and $b \in \mathbb{Z} \setminus \{0\}$.

11. The apparatus of claim 7, wherein the input is configured to receive a first digital baseband signal at a first baseband clock rate and to receive at least a second digital baseband signal at a second baseband clock rate;

wherein the processor is configured to modulate pulses of a first digital pulse sequence at a first carrier clock rate based on the first digital baseband signal, wherein the pulses of the first digital pulse sequence are quantized based on a time grid of an output clock rate, and to modulate pulses of a second digital pulse sequence at a second carrier clock rate based on the second digital baseband signal, wherein the pulses of the second digital pulse sequence are quantized based on the time grid of the output clock rate, wherein a ratio between a number of carrier clock cycles corresponding to one respective baseband clock cycle and a number of output clock cycles corresponding to one respective baseband clock cycle is non-integer.

12. The apparatus of claim 7, wherein the apparatus is configured to set the first clock rate below 500 MHz, to set the second clock rate between twice and 50 times the first clock rate, and to set the third clock rate higher than 50 times the first clock rate.

13. The apparatus of claim 7, further comprising:

a memory accessible by the processor and having stored thereon at least one of the following parameters: $N_1$, $N_2$, a, b, center frequency, wherein $N_1$ represents a ratio between the second and first clock rate, $N_2$ represents a ratio between the third and the first clock rate, $a \in \mathbb{N}^+$, $b \in \mathbb{Z} \setminus \{0\}$, with $f_3 = a * f_2 - b * f_1$, wherein $f_1$ denotes the first clock rate, $f_2$ denotes the second clock rate, $f_3$ denotes the third clock rate.

14. A transmitter to generate and transmit at least one RF signal, the transmitter comprising:

the apparatus of claim 7, an analog power amplifier configured to amplify the modulated digital pulse sequence;

an analog filter configured to filter the amplified pulse sequence to generate an analog RF signal; and one or more antennas configured to transmit the analog RF signal.

15. The transmitter of claim 14, further comprising a first antenna configured to transmit the first modulated pulse sequence; and a second antenna configured to transmit the second modulated pulse sequence.

* * * * *